United States Patent
Wueest et al.

(10) Patent No.: US 8,461,822 B2
(45) Date of Patent: Jun. 11, 2013

(54) TEMPERATURE COMPENSATED FIBER OPTIC CURRENT OR MAGNETIC FIELD SENSOR WITH INSENSITIVITY TO VARIATIONS IN SENSOR PARAMETERS

(75) Inventors: Robert Wueest, Zurich (CH); Andreas Frank, Zurich (CH); Klaus Bohnert, Oberrohrdorf (CH)

(73) Assignee: ABB Research Ltd, Zurich (CH)

( * ) Notice: Subject to any disclaimer, the term of this patent is extended or adjusted under 35 U.S.C. 154(b) by 453 days.

(21) Appl. No.: 12/889,775

(22) Filed: Sep. 24, 2010

(65) Prior Publication Data
US 2011/0074393 A1    Mar. 31, 2011

(30) Foreign Application Priority Data
Sep. 30, 2009  (EP) ..................................... 09171889

(51) Int. Cl.
*G01R 31/00* (2006.01)
(52) U.S. Cl.
USPC ............... 324/96; 356/477; 356/491; 385/11; 385/12; 385/31; 250/227.11; 250/227.14; 250/227.17; 250/227.19
(58) Field of Classification Search
USPC ................. 324/95, 96; 356/477, 491; 385/11, 385/12, 31; 250/227.11, 227.14, 227.17, 250/227.19
See application file for complete search history.

(56) References Cited

U.S. PATENT DOCUMENTS

| 4,894,608 A | 1/1990 | Ulmer, Jr. |
| 5,780,847 A | 7/1998 | Dawson et al. |
| 5,953,121 A * | 9/1999 | Bohnert et al. ............... 356/481 |
| 6,301,400 B1 * | 10/2001 | Sanders ........................ 385/12 |
| 6,628,869 B2 | 9/2003 | Bohnert et al. |
| 6,734,657 B2 * | 5/2004 | Bohnert et al. ................ 324/96 |
| 7,075,286 B2 * | 7/2006 | Bohnert ........................ 324/96 |
| 7,339,680 B2 * | 3/2008 | Bohnert et al. ............... 356/483 |
| 8,320,719 B2 * | 11/2012 | Wueest et al. .................. 385/12 |
| 2001/0002944 A1 | 6/2001 | Bohnert et al. |
| 2001/0050551 A1 | 12/2001 | Bohnert et al. |
| 2007/0052971 A1 * | 3/2007 | Bohnert et al. ............... 356/491 |

FOREIGN PATENT DOCUMENTS

| EP | 0 856 737 B1 | 9/2002 |
| EP | 1 115 000 B1 | 12/2006 |
| EP | 1 107 029 B1 | 1/2008 |
| WO | WO 97/13155 A1 | 4/1997 |
| WO | WO 2005/111633 A1 | 11/2005 |

OTHER PUBLICATIONS

European Search Report dated Mar. 4, 2010, issued in the corresponding European Application No. 09171887.4-2216.

(Continued)

*Primary Examiner* — John Fitzgerald
*Assistant Examiner* — Hoang Nguyen
(74) *Attorney, Agent, or Firm* — Buchanan Ingersoll & Rooney PC

(57) ABSTRACT

A fiber optic current or magnetic field sensor uses a sensing fiber in a coil for measuring a current or a magnetic field and has a retarder for converting between linearly polarized light and elliptically polarized light. The retardation of the retarder, its temperature dependence as well as its azimuth angle in respect to the plane of the fiber coil are optimized in dependence of the birefringence in the sensing fiber in order to minimize the influence of temperature variations and manufacturing tolerances on the overall scale factor of the sensor.

19 Claims, 6 Drawing Sheets

OTHER PUBLICATIONS

Wueest et al., U.S. Appl. No. 12/891,399, entitled "Method for Manufacturing a Fiber Optic Current Sensor with Inherent Temperature Compensation of the Faraday Effect" filed Sep. 27, 2010.

European Search Report dated Mar. 9, 2010.

K. Bohnert et al., "Temperature and Vibration Insensitive Fiber-Optic Current Sensor", Journal of Lighwave Technology, vol. 20, No. 2, Feb. 2002, pp. 267-276.

Z.B. Ren et al., "Temperature dependence of bend- and twist-induced birefringence in a low-birefringence fiber", Optics Letters, vol. 13, No. 1, Jan. 1988, pp. 62-64.

Klause Bohnert et al., "Fiber-Optic Current Sensor for Electrowinning of Metals", Journal of Lightwave Technology, vol. 25, No. 11, Nov. 2007, pp. 3602-3609.

H. Lefevre, "The Fiber-Optic Gyroscope", Chapter 2 Principle of the Fiber-Optic Gyroscope, Artech House, London 1993, 30 pages.

Herve C. Lefevre, "Fundamentals of the Interferometric Fiber-Optic Gyroscope", Proc. SPIE vol. 2837, 1996, pp. 2-17.

K. Bohnert et al., "Experimental and theoretical investigations of the high current regime of an interferometric fiber-optic current sensor", IEEE Sensors 2008 Conference, pp. 926-929.

Juichi Noda et al., "Polarization-Maintaining Fibers and Their Applications", Journal of Lightwave Technology, vol. LT-4, No. 8, Aug. 1986, pp. 1071-1089.

\* cited by examiner

TEMPERATURE COMPENSATED FIBER OPTIC CURRENT OR MAGNETIC FIELD SENSOR WITH INSENSITIVITY TO VARIATIONS IN SENSOR PARAMETERS

RELATED APPLICATION

This application claims priority under 35 U.S.C. §119 to European Patent Application No. 09171889.0 filed in Europe on Sep. 30, 2009, the entire content of which is hereby incorporated by reference in its entirety.

FIELD

The disclosure relates to sensors, such as a fiber optic current sensor (FOCS) or magnetic field sensor that includes a sensing fiber to be exposed to a magnetic field, e.g. of a current to be measured. This type of sensor is typically used in high voltage or high current applications.

BACKGROUND INFORMATION

Fiber-optic current sensors commonly rely on the Faraday effect in fused silica fibers. The Faraday-effect varies with temperature. The Verdet constant V of fused silica fiber, which is a measure for the Faraday effect, changes according to $(1/V)\partial V/\partial T = 7 \times 10^{-5}$ °C.$^{-1}$, i.e. within a temperature range of operation of e.g. $-40°$ to $+80°$ C. the sensor signal varies within 0.84%. Many applications of the sensor require accuracy to within $\pm 0.2\%$ or $\pm 0.1\%$, however, and therefore require measures for temperature compensation. In EP 1107029, EP 1115000 and K. Bohnert, P. Gabus, J. Nehring, H. Brändle, "*Temperature and Vibration Insensitive Fiber-Optic Current Sensor*", J. Lightwave Technol., 20(2), 267, (2002) a method was described for inherent temperature compensation of the Faraday effect in interferometric Sagnac and reflection-type fiber-optic current sensors. The method of inherent compensation eliminates the need of an extra temperature sensor, which is particularly important for current sensing at high electric potentials. The method exploits the temperature dependence of the fiber-optic retarder which generates the normally circular light waves propagating in the sensing fiber. For temperature compensation the retardation is set to a value which differs by a non-zero amount $\epsilon$ from the conventional 90°-retardation. The variation of the retardation with temperature affects the scale factor of the sensor. At the properly chosen retardation, e.g. with $\epsilon=10°$, the influence of the retarder on the sensor sensitivity (scale factor S) just balances the variation of the Verdet constant with temperature.

In WO 2005/111633 and K. Bohnert, P. Gabus, J. Nehring, H. Brändle, M. Brunzel, "*Fiber-Optic Current Sensor for Electrowinning of Metals*", J. Lightwave Technol., 25(11), 3602, (2007) it was shown that the sensor scale factor S is also influenced by the angle between the normal of the fiber coil plane and the slow axis of the polarization maintaining fiber before the retarder, called azimuth angle $\beta=45°-\beta'$, with $\beta'$ being the angle between the normal of the fiber coil plane and the slow axis of the retarder. The sensing fiber coil consists of a single loop of non-annealed single-mode fiber with a large loop radius and thus small bend-induced linear birefringence. The fiber resides in a capillary with friction reducing means and was packaged in a flexible strip of fiber reinforced epoxy. The variation of the scale factor S with the azimuth angle $\beta$ is sinusoidal and varies within 0.8% of a retarder with $\epsilon=10°$ and a birefringent retardation in the sensing fiber of 1.5°. Hence, to achieve a stable scale factor, the azimuth angle must be controlled and fixed. In WO 2005/111633 preferred azimuth angles of $\beta=0°$ (modulo 90°) and $\beta=45°$ (modulo 90°) are said to achieve minimum sensitivity of the scale factor to variations of the bend induced birefringence and the azimuth angle, respectively. The effects of the temperature dependence of the bend induced birefringence [3] were neglected as they were very small in that case. However, a sensor fiber coil is conceivable and consists of several (non-annealed) fiber windings of small diameter. Such coils may be used, e.g. for integration into high-voltage (HV) equipment. In coils of this type a larger amount of fiber birefringence may be present, causing a birefringent phase retardation of e.g. $\delta=5\ldots 25°$.

In EP 0856737 and K. Bohnert, P. Gabus, J. Nehring, H. Brändle, "*Temperature and Vibration Insensitive Fiber-Optic Current Sensor*" J. Lightwave Technol., 20(2), 267, (2002) a method of high temperature annealing was explained to efficiently reduce the bend induced birefringence in small diameter fiber coils with several fiber windings. The fiber of such coils may again reside in a glass capillary both during the annealing procedure and in the final sensor configuration. Depending on the coil diameter and the number of windings some birefringence may remain in the sensing fiber after annealing. The corresponding birefringent phase shifts can be of the order of several degrees. Furthermore, in a production environment the birefringence may vary from coil to coil to some extent. Variations in the birefringence as a result of tolerances in the production process and/or due to temperature variations affect the above mentioned temperature compensation of the Faraday effect. This is true both for annealed and non-annealed coils.

SUMMARY

A fiber optic current sensor or magnetic field sensor is disclosed that comprises a sensing fiber exposed to a magnetic field of a current I, wherein said sensing fiber is looped in a sensor coil plane, and wherein said sensing fiber has a Verdet constant V; at least one retarder arranged between a polarization-maintaining fiber and said sensing fiber for converting light between linear and elliptical polarization, wherein a principal axis of said polarization-maintaining fiber is rotated with respect to a normal of said sensor coil plane by an angle $\beta$ and wherein said retarder introduces a retardation $\rho=\pi/2+\epsilon$ between light waves polarized along its principal axes, with $\epsilon$ being an additional, non-zero phase shift; and a control unit generating a signal proportional to a phase shift $\Delta\phi$, which signal is proportional to 4 S($\epsilon$, $\delta$, $\beta$, $\phi_F$)·V·N·I=4 S($\epsilon$, $\delta$, $\beta$, $\phi_F$)·$\phi_F$, wherein N is a number of loops of said sensing fiber, $\delta$ is a linear birefringence induced phase shift of said sensing fiber, $\phi_F$ is a Faraday phase shift and S is a scale factor, wherein a normalized derivative of S with respect to temperature T is $$Z(\varepsilon(T), \delta(T), \beta, \varphi_F) = \frac{1}{S} \frac{\partial S(\varepsilon, \delta, \beta, \varphi_F)}{\partial T}$$

wherein $\beta$, $\epsilon$ and $$Q = \frac{1}{\rho} \frac{\partial \rho}{\partial T}$$

are specified such that $$\left| Z + \frac{1}{V} \frac{\partial V}{\partial T} \right| < t_1$$

is fulfilled over a range of values of $\phi_F$ and for a non-zero value of the linear-birefringence-induced phase shift $\delta$ and its given temperature dependence $$P = \frac{1}{\delta}\frac{\partial \delta}{\partial T},$$

at least at a temperature $T_0$, in particular in a center of an operating temperature range of the sensor, with $t_1$ being a first threshold value smaller than $7*10^{-5}$ 1/K, in particular smaller than $2*10^{-5}$ 1/K.

BRIEF DESCRIPTION OF THE DRAWINGS

The disclosure will be better understood and objects other than those set forth above will become apparent from the following detailed description thereof. Such description makes reference to the annexed drawings, wherein.

DETAILED DESCRIPTION

Sensor Design

Figure 1:
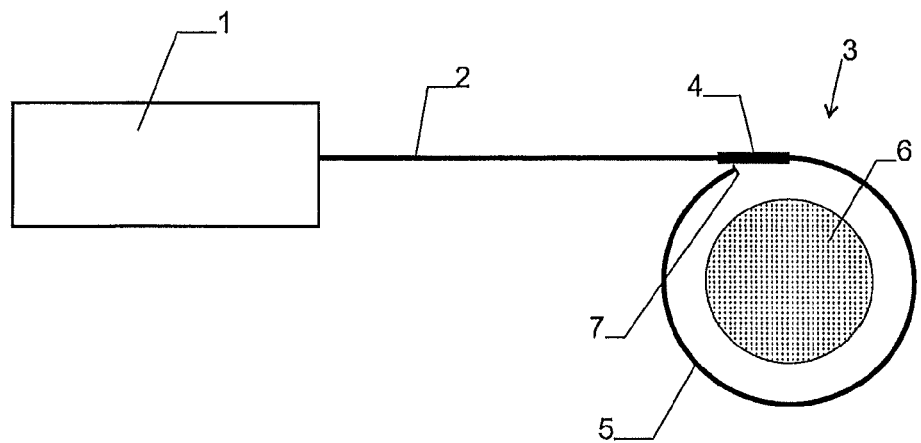
FIG. 1 is a diagram of a fiber-optic current sensor in accordance with a known system.

FIG. 1 is a diagram of a fiber-optic current sensor in accordance with a known system. In particular, working principle of a fiber-optic current sensor as described in K. Bohnert, P. Gabus, J. Nehring, H. Brändle, "*Temperature and Vibration Insensitive Fiber-Optic Current Sensor*" *J. Lightwave Technol.*, 20(2), 267, (2002) is depicted in FIG. 1. Two orthogonal linearly polarized light waves are sent from a control unit 1 through a connecting polarization-maintaining fiber (pm fiber) 2 to a sensing head, generally denoted by 3. Sensing head 3 comprises an optical retarder 4, a sensing fiber 5, and a reflector 7.

Retarder 4, for example, is e.g. a fiber optic retarder with an elliptical core and serves to convert between the linearly polarized light in pm fiber 2 and elliptically polarized light in sensing fiber 5. Retarder 4 has two principal axes and its retardation is adapted to induce a phase shift $\pi/2+\epsilon$ between light waves polarized along its principal axes, with $\epsilon$ being an additional, non-zero phase shift.

Sensing fiber 5 is looped N>0 times around one or more current conductors 6 carrying the current I which is to be measured. In the present embodiment, a reflector 7 can be arranged at the end of sensing fiber 5 for reflecting the light back through sensing fiber 5, retarder 4, pm fiber 2 into control unit 1. Right and left circular light waves have different phase velocities while traveling in the magnetic field around the conductor due to the Faraday effect. In the embodiment of FIG. 1, the light waves acquire a phase difference $\Delta\phi$ given by $$\Delta\phi = 4\cdot\phi_F = 4V\cdot N\cdot I \tag{1}$$

Here, V is the Verdet constant, N is the number of sensing fiber loops around conductor 6, and I is the current. Eq. (1) is valid for a fiber coil free of any linear birefringence ($\delta$=0) and perfectly circular light waves ($\epsilon$=0°).

After being transformed back into linear polarizations by retarder 4, the magnetic field introduced phase difference is measured by control unit 1 with a technique adapted from fiber-optic gyroscopes as described in K. Bohnert, P. Gabus, J. Nehring, H. Brändle, "*Temperature and Vibration Insensitive Fiber-Optic Current Sensor*" *J. Lightwave Technol.*, 20(2), 267, (2002) and H. Lefevre, "*The Fiber-Optic Gyroscope*", Artech House, London, 1993 and H. Lefevre, "*Fundamentals of the Interferometric Fiber Optic Gyroscope*", *Proc. SPIE*, 2837, pp. 2-17, (1996).

Figure 2:
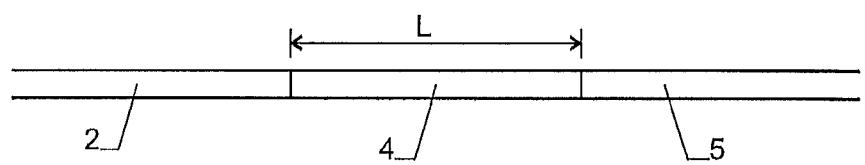
FIG. 2 illustrates an embodiment of a fiber-optic retarder in accordance with an exemplary embodiment.
Figure 3:
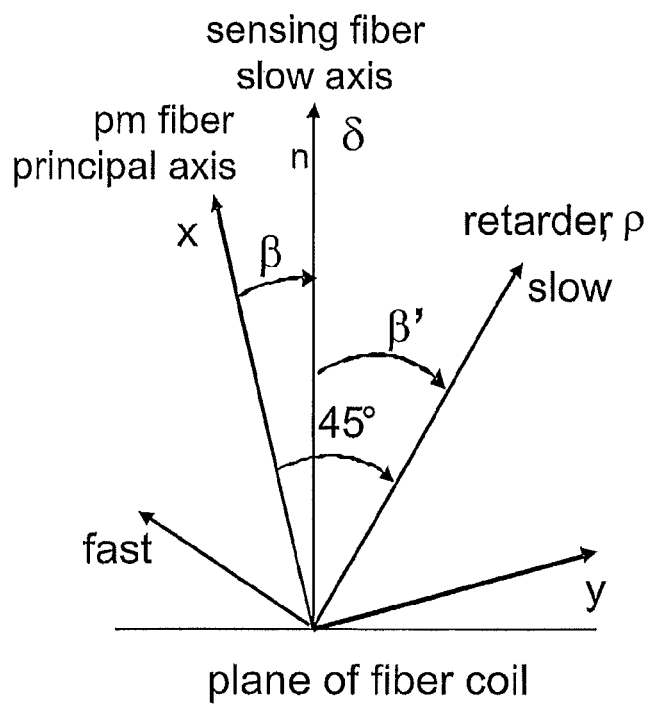
FIG. 3 illustrates the rotational orientation of the retarder and the polarization-maintaining fiber before the retarder with respect to the sensing fiber plane in accordance with an exemplary embodiment.

Retarder 4 can be a fiber-optic retarder fabricated at the end of a section of polarization maintaining fiber 2 adjacent to the low birefringence sensing fiber 5 as shown in FIG. 2. In FIG. 2, the slow principal axis of the retarder fiber can be oriented at +45° with respect to a first principal axis of the pm fiber immediately before the retarder as is shown in FIG. 3. (Note that to make the definition of $\beta$ unambiguous, the principle axis of the pm fiber 2 is selected such that the slow principal axis of the retarder fiber is oriented at +45° with respect to the first principal axis of the pm fiber 2. The slow principal axis of the retarder fiber is then oriented at −45° with respect to the other, second principal axis of the pm fiber 2).

The polarization maintaining fiber 2 can be variously implemented through several types of polarization maintaining fibers, e.g. an elliptical core fiber or fibers with an internal stress field (Panda, Bowtie, elliptical cladding). This type of device is described in EP 1107029.

The retardation of retarder 4 deviates from the $\pi/2$ retardation of a perfect quarter-wave retarder by an appropriately chosen amount (i.e. the phase shift between the two orthogonal polarization modes is $\rho > \pi/2$ or $\rho < \pi/2$), in order to compensate for the temperature dependence of the Verdet constant V. The retardation of retarder 4 is chosen such that the two main sources of scale factor temperature dependence compensate each other: (i) V(T), the increase of the Verdet constant V with temperature T, and (ii) S(T), the decrease of the scale factor term S due to a temperature induced change in the retardation $\rho$ and the temperature induced increase of birefringence δ. It should be understood that elliptical-core fibers can be preferably used for retarder fabrication and can exhibit a decrease of ρ at increasing temperature. A properly chosen optical length of the retarder (e.g. ρ~100° for a given temperature dependence Q of ρ and a small amount of birefringence in the fiber) can compensate the temperature dependence of the magneto-optic effect, i.e. to fabricate a sensor with a temperature-independent overall scale factor. The choice of the correct retardation ρ of the retarder may also be ρ<90° and it depends on the values of the following parameters: the birefringence δ present in the sensing fiber and its temperature dependence P, the azimuth angle β, and the temperature dependence Q of ρ. Temperature independence of the sensor can be specified, for example, in order to fulfill the accuracy requirements (accuracy to within ±0.2% or even ±0.1% over a temperature from e.g. −40 to 85° C.) in sensor applications, as desired.

Working Principle

In WO 2005/111633 and K. Bohnert, P. Gabus, J. Nehring, H. Brändle, M. Brunzel, *"Fiber-Optic Current Sensor for Electrowinning of Metals"*, J. Lightwave Technol., 25(11), 3602, (2007), the scale factor of a temperature-compensated sensor (ρ≠90°) with fiber linear birefringence (δ≠0°) is influenced by three sensor head parameters: the retardation ρ=π/2+ε of the retarder, the birefringence δ in the sensing fiber and the azimuth angle β. The azimuth angle β is shown in FIG. 3 as the angle between a principal axis x of the pm fiber before the retarder 4 and the normal vector n of the plane in which the coil of sensing fiber 5 resides.

The parameter δ refers to the bend-induced fiber linear birefringence or residual bend-induced fiber linear birefringence remaining after thermal annealing of a fiber coil. In addition, there may be intrinsic fiber linear birefringence $δ_i$, e.g. due to fiber anisotropies or built-in stress. Commonly, $δ_i$ may be neglected for state of the art low-birefringence sensing fibers.

The magneto-optic phase shift Δφ observed by the present device can be represented as $$\Delta\phi = 4S(\epsilon, \delta, \beta, \phi_F) \cdot \phi_F \quad (2)$$

where $\phi_F = V \cdot N \cdot I$ S is a normalized scale factor term, which is equal to unity for ε=0° and δ=0°, and Δφ is given by $$\Delta\phi = \arctan\left(\frac{2U}{1-U^2}\right) \quad (3)$$

with $$U = \frac{2\varphi_F \frac{\tan(\Gamma)}{\Gamma}}{\cos(\epsilon) - \delta\sin(\epsilon)\sin(2(\beta+\psi))\frac{\tan(\Gamma)}{\Gamma}}, \quad (4)$$

$$\Gamma = [\delta'^2 + (2\varphi_F)^2]^{1/2}, \quad (5)$$

$$\delta' = [\delta^2 + \delta_i^2 + 2\delta\delta_i\cos(2(\beta_i - \beta))]^{1/2}, \text{ and} \quad (6)$$

$$\psi = \arctan\left(\frac{\delta_i\sin(2(\beta_i - \beta))}{\delta + \delta' + \delta_i\cos(2(\beta_i - \beta))}\right),$$

where $β_i$ defines the axes of the intrinsic fiber birefringence.

In the exemplary embodiments described herein the intrinsic birefringence $δ_i$ is neglected if not mentioned otherwise. Furthermore, small Faraday phase shifts can be considered where it is assumed that $φ_F \ll 1$. Conditions rated currents present in high-voltage substations (up to a few kiloamperes) and fiber coils having a small number of fiber windings (e.g. 1-10 windings) can be considered. Modifications at larger Faraday phase shifts are addressed further below.

At small Faraday phase shifts the scale factor term S=S (ε, δ, β, $φ_F$) can be assumed to be independent of $φ_F$, i.e. S is then only a function of ε, δ and β. With approximations accurate to within roughly ΔS/S=10⁻⁴, S is given by:

$$S(\epsilon, \delta, \beta) = \frac{1 + \frac{1}{3}\delta^2}{\cos(\epsilon) - \delta\sin(2\beta)\sin(\epsilon)}. \quad (7)$$

Figure 4:
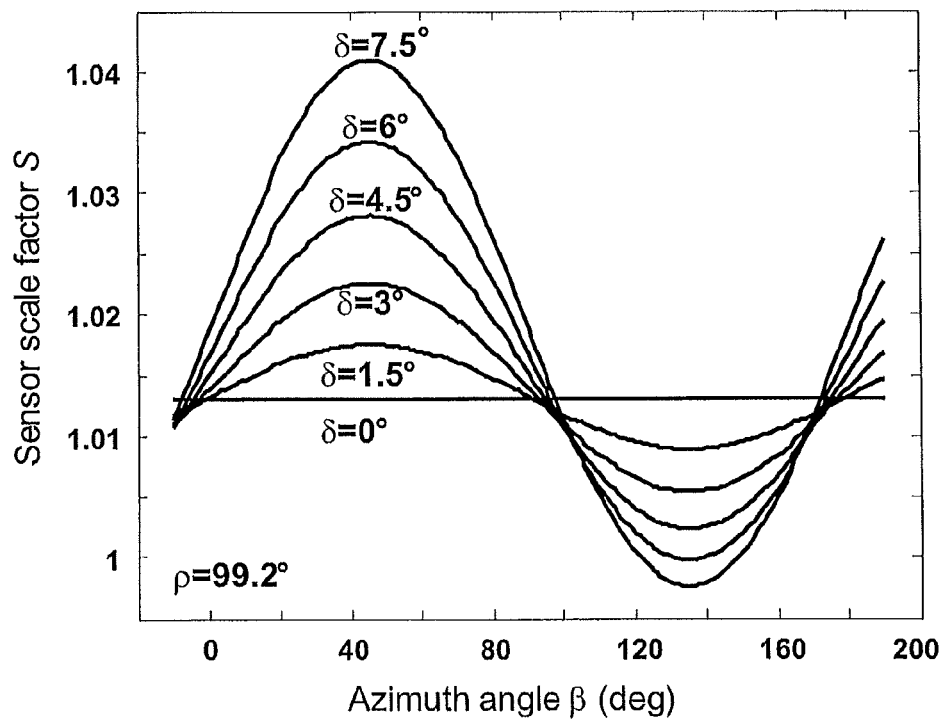
FIG. 4 shows the scale factor S as a function of azimuth angle $\beta$ in accordance with an exemplary embodiment.

FIG. 4 illustrates a scale factor as a function of azimuth angle β. In particular, the dependence of the scale factor term S on the azimuth angle β is depicted in FIG. 4 for different values of δ. As shown in FIG. 4 for non-negligible birefringence δ in the sensing fiber, the sensor scale factor S becomes sensitive to the azimuth angle. Also, the peak-to-peak variation of S vs. β increases in proportion to the product of δ and ε. The deviation of the mean value of S from unity is approximately equal to (⅓) δ²+(½) ε².

In order to minimize the temperature dependence of the phase shift Δφ of Eq. (2), the normalized temperature dependence Z of scale factor S should be equal but opposite in sign to the normalized temperature dependence of the Verdet constant V, i.e.

$$Z = \frac{1}{S}\frac{\partial S(\epsilon, \delta, \beta)}{\partial T} = -\frac{1}{V}\frac{\partial V}{\partial T} \quad (8)$$

Figure 5:
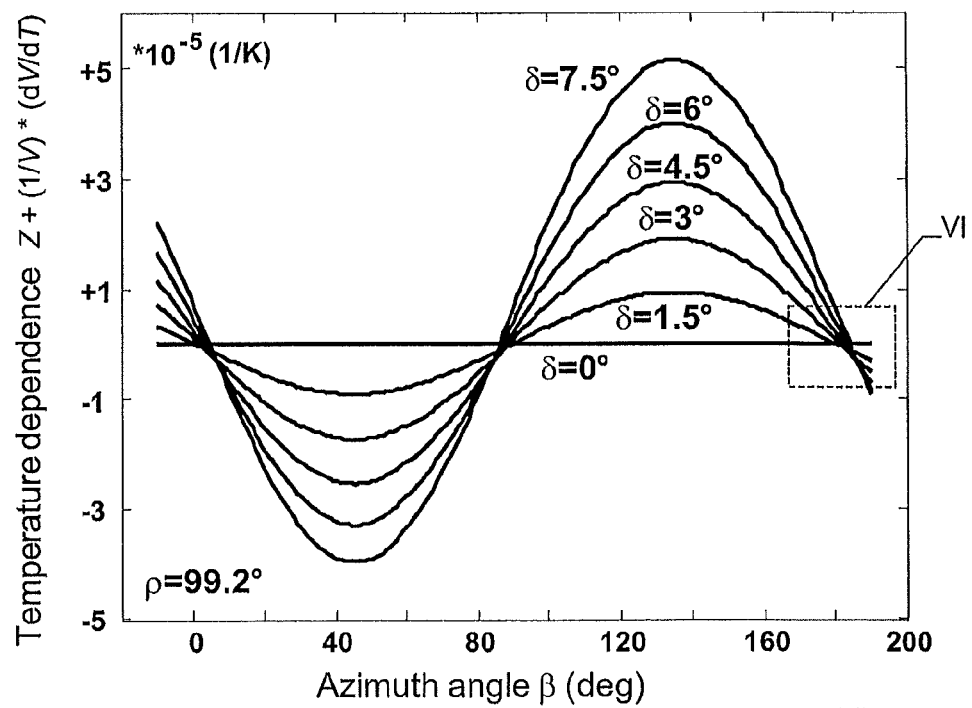
FIG. 5 is a graphical illustration of the temperature dependence Z of the scale factor S versus azimuth angle $\beta$ in accordance with an exemplary embodiment.

FIG. 5 is a graphical illustration of the temperature dependence Z of the scale factor S versus azimuth angle β, in accordance with an exemplary embodiment. The graph of FIG. 5 shows the variation in the overall temperature dependence Z+1/V. ∂V/∂T of the fiber coil as a function of the azimuth angle β for different amounts of birefringence δ and a retardation ρ=99.2° of the retarder. For a value of δ=7.5°, Z varies by as much as approximately ±4.5·10⁻⁵ K⁻¹ as a function of β. In an exemplary embodiment, the sensor scale factor S should be independent of temperature, i.e.

$$Z = -\frac{1}{V}\frac{\partial V}{\partial T}. \quad (9)$$

In some applications, an accurate match as in Eq. (9) may not be achieved, and, therefore, the deviation from equality in (9) can be smaller than a reasonably small first threshold value $t_1$, i.e.

$$\left|Z + \frac{1}{V}\frac{\partial V}{\partial T}\right| < t_1. \quad (9')$$

An exemplary first threshold value $t_1$ is 7*10⁻⁵ 1/K, i.e. the temperature dependence of the Verdet constant. In many cases, the temperature dependence may be sufficient if $t_1$ is smaller than 2*10⁻⁵ 1/K or smaller than 1*10⁻⁵ 1/K.

When evaluated under the assumption that δ is temperature dependent, i.e. ∂δ/∂T≠0, Eq. (9) provides a condition between the values of Q, ε and β, which, if fulfilled, can lead to an inherent temperature independence of the device including the effects of the temperature dependence of the Verdet constant and the temperature dependence of the birefringence δ.

The implementation of eq. (9) leaves two degrees of freedom, which can e.g. be used to optimize the values of Q, ϵ and β in view of further design criteria.

The following exemplary embodiments are directed to design criteria, which can be used to optimize the design of the sensor by choosing suitable values for Q, ϵ or β.

Minimizing the Dependence of Z on δ in Accordance with an Exemplary Embodiment

In EP 0856737 and K. Bohnert, P. Gabus, J. Nehring, H. Brändle, *"Temperature and Vibration Insensitive Fiber-Optic Current Sensor" J. Lightwave Technol.*, 20(2), 267, (2002) a thermal annealing method is described that reduces the bend induced birefringence for small diameter fiber coils (e.g. with diameters of 100-200 mm) with several windings, as desired, e.g. for high-voltage substations. In practice, however, birefringence may remain in the sensing fiber after annealing, which can induce a differential phase shift δ on the order of several degrees depending on the coil diameter and the number of windings. Furthermore, this residual birefringence can vary from coil to coil to a certain extent in a production environment: $\delta=\delta_0\pm\Delta\delta$.

Therefore, ideally, the value of Z should be independent (in linear approximation) of variations in δ as a result of e.g. fabrication tolerances, i.e.:

$$X(\varepsilon, \beta, \delta) = \frac{\partial Z}{\partial \delta} = \frac{\partial}{\partial \delta}\left(\frac{1}{S}\frac{\partial S}{\partial T}\right) = 0 \quad (10)$$

An accurate match of the condition of Eq. (10) may not be achieved due to manufacturing tolerances and, therefore, the error in Eq. (10) should be smaller than a reasonably small second threshold value $t_2$, i.e., $$\left|\frac{\partial Z}{\partial \delta}\right| < t_2 \quad (10')$$

An exemplary second threshold value $t_2$ giving good temperature independence but accounting for manufacturing tolerances is $2*10^{-3}$ ($K^{-1}*rad^{-1}$), in particular smaller than $0.5*10^{-3}$ ($K^{-1}*rad^{-1}$).

Figure 6:
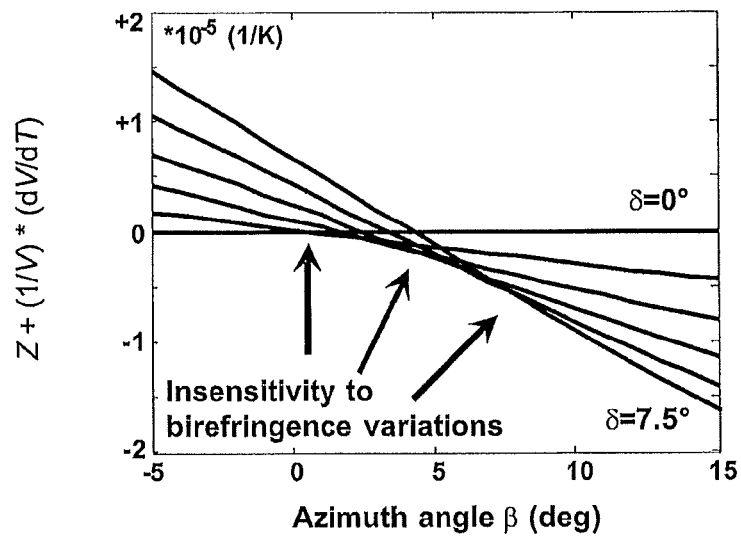
FIG. 6 is a graphical illustration of an enlarged section VI of the graph of FIG. 5 in accordance with an exemplary embodiment.
Figure 7:
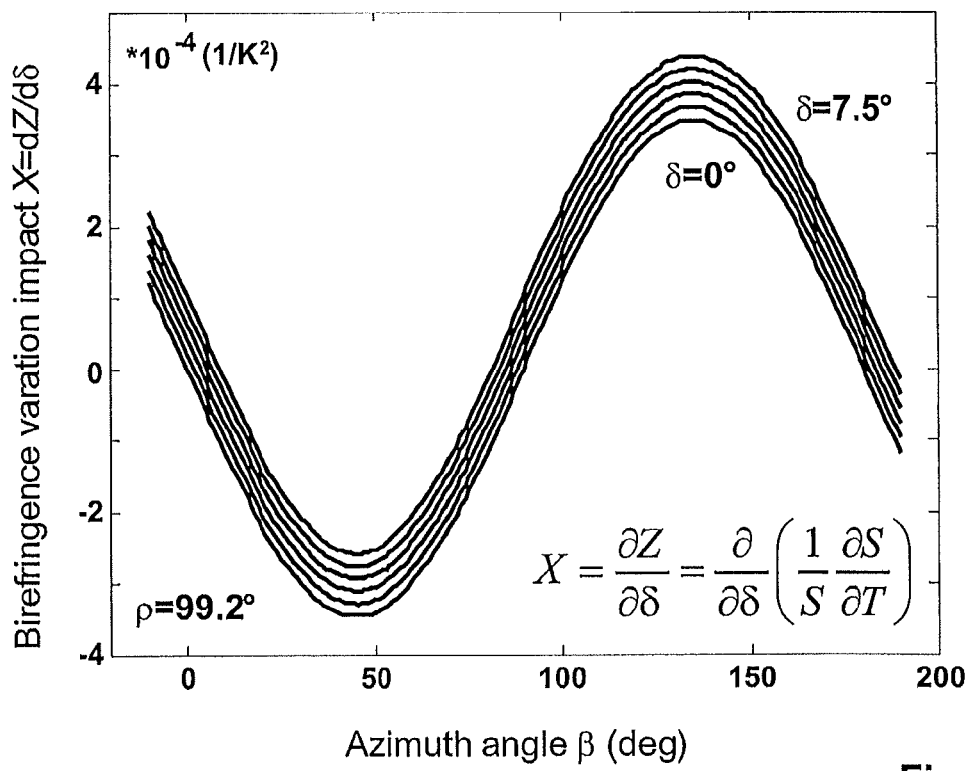
FIG. 7 is a graphical illustration of the birefringence variation impact X on the scale factor temperature dependence Z as a function of azimuth angle $\beta$ in accordance with an exemplary embodiment.

As explained in WO 2005/111633, a preferred azimuth angle is β=0° (modulo 90°). Here, a sensing fiber coil with a single loop of non-annealed fiber with large radius and thus small bend-induced birefringence (δ=1°-2°) was considered. Such a coil design can be implemented in applications related to the electro-winning of metals such as aluminum. Variations of δ with temperature can be neglected in this case due to the small value of δ. In case of larger amounts of birefringence, e.g. the remaining birefringence in annealed sensing fiber coils of small diameter or the full bend-induced birefringence of non-annealed coils of small diameter, the optimum value of β—as required for minimizing the sensitivity to temperature and birefringence variations Δδ—deviates from β=0° due to the fact that $\partial\delta/\partial T \neq 0$. This can be seen from FIG. 6, which corresponds to enlargement window VI of FIG. 5, where the zero-crossing of Z(β) is tends toward larger values of β for increasing amounts of birefringence δ. Furthermore, the mutual crossing of the neighboring Z(β)-curves for different values of δ also moves to larger values of β. The same information can be gained from FIG. 7 where X=dZ/dδ, i.e. the dependence of the scale factor temperature dependence Z on variations of the birefringence, is shown vs. β for different values of δ. The point where X(β) crosses the zero line (insensitivity to variations in δ) moves to higher values of β.

Additional exemplary embodiments disclosed herein are directed to a sensing coil design which, for a given value of δ, is characterized by a pair of parameters ρ (or ϵ) and β chosen to simultaneously achieve X=0 (i.e. the temperature dependence of scale factor is not affected by variations in δ) and a preselected value of the sensor temperature dependence, namely as given by Eq. (9). A numerical algorithm allows one to find the optimum parameters $\epsilon_{opt}$ (or $\rho_{opt}$) and $\beta_{opt}$ for a given (measured or calculated) amount of birefringence δ in the sensing fiber.

Figure 8:
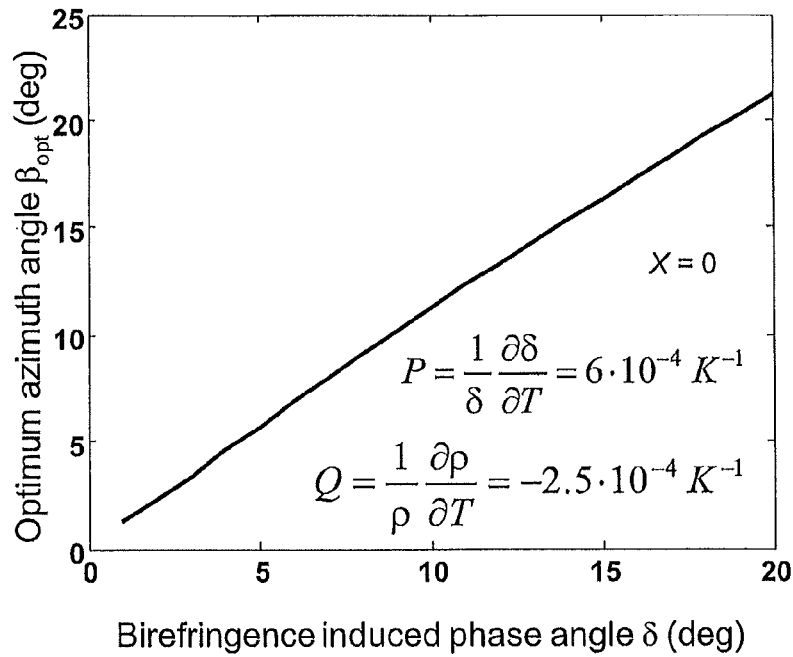
FIG. 8 is a graphical illustration of the optimum azimuth angle $\beta_{opt}$ vs. birefringence $\delta$ for X=0 in accordance with an exemplary embodiment.

FIG. 8 is a graphical illustration of an optimum azimuth angle $\beta_{opt}$ vs. birefringence δ for X=0, in accordance with an exemplary embodiment. FIG. 8 shows the calculated optimum azimuth angle $\beta_{opt}$ vs. birefringence induced phase angle δ for typical values, P and Q, of the temperature dependence of δ and ρ, respectively.

Figure 9:
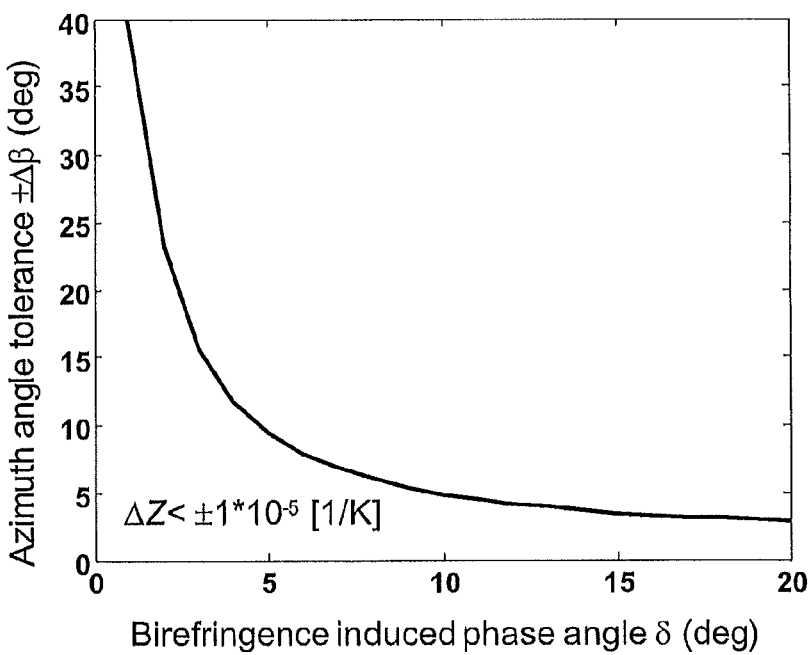
FIG. 9 is a graphical illustration of the azimuth angle tolerance $\Delta\beta$ vs. birefringence $\delta$ for X=0 in accordance with an exemplary embodiment.

FIG. 9 is a graphical illustration of an azimuth angle tolerance Δβ vs. birefringence δ for X=0 in accordance with an exemplary embodiment. In the graph of FIG. 9, the azimuth angle tolerance Δβ is calculated that must be observed in order to stay within $\Delta Z < \pm 1\cdot 10^{-5}$ $K^{-1}$ (ΔZ=variations of Z). For small amounts of birefringence the tolerance for β can be large, but for δ=10°, the optimum value can be $\beta_{opt}=11°\pm 5°$, which is significantly different from β=0°, which would be the optimum value when neglecting the temperature dependence of the birefringence.

Figure 10:
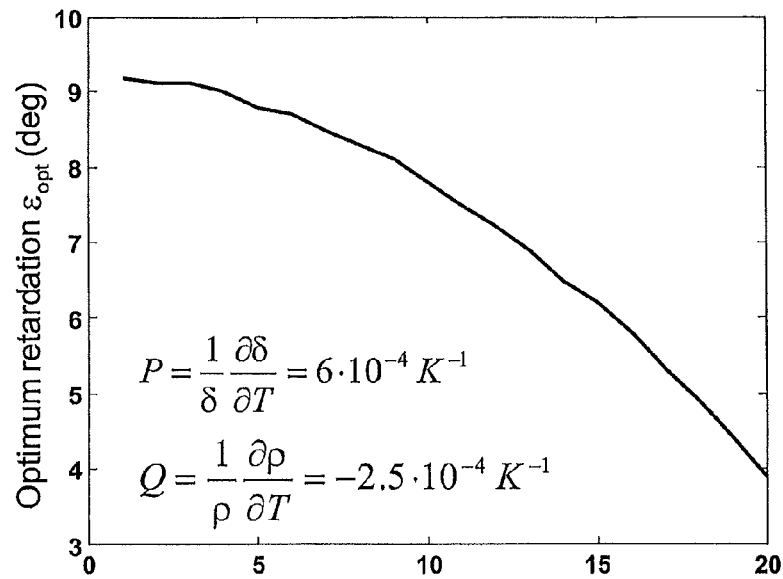
FIG. 10 is a graphical illustration of the optimum retardation term $\epsilon_{opt}$ vs. birefringence $\delta$ for X=0 in accordance with an exemplary embodiment.

FIG. 10 is a graphical illustration of an optimum retardation term $\epsilon_{opt}$ vs. birefringence δ for X=0 in accordance with an exemplary embodiment. FIG. 10 depicts the corresponding retardation term $\epsilon_{opt}$ needed to achieve temperature compensation (Z+1/V·∂V/∂T=0) at the optimum azimuth angle $\beta_{opt}$ for the same set of parameters P and Q as in FIG. 8. The two parameters $\epsilon_{opt}$ and $\beta_{opt}$ can be calculated simultaneously with a script, such as a Matlab script in a numerical manner.

Figure 11:
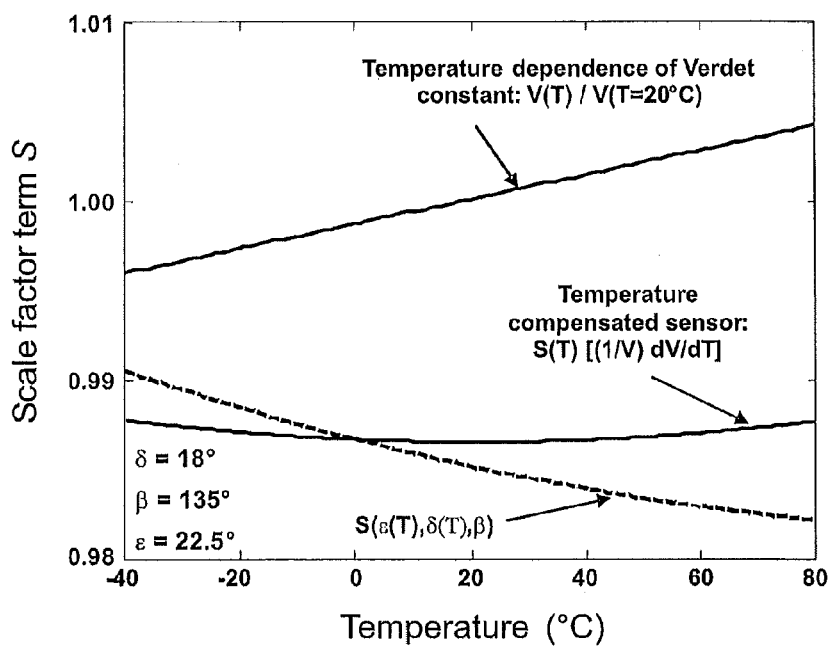
FIG. 11 is a graphical illustration of the scale factor term S, the temperature dependence of the Verdet constant, and their combined contributions of a temperature compensated sensor as a function of the temperature T for a non-annealed coil with four windings, a coil diameter of 15 cm, and a fiber diameter of 80 µm in accordance with an exemplary embodiment.

FIG. 11 is a graphical illustration of the scale factor term S, the temperature dependence of the Verdet constant, and their combined contributions of a temperature compensated sensor as a function of the temperature T for a non-annealed coil with four windings, a coil diameter of 15 cm, and a fiber diameter of 80 μm in accordance with an exemplary embodiment. FIG. 11 shows the overall scale factor vs temperature (solid line) of a temperature-compensated sensor with an optimally chosen value ϵ (and thus ρ) for a pre-selected value β=135° assuming a non-annealed fiber coil with four windings, a fiber diameter of 80 μm, and a coil diameter of 15 cm. These conditions result in a retardation δ of 18° at a wavelength of 1310 nm. For the given parameters, ϵ can be selected as 22.5° in order to achieve temperature compensation. The dashed-dotted line represents the normalized variation of the Verdet constant with temperature and the dashed line shows the variation in the scale factor term S that compensates the increase in the Verdet constant.

In the exemplary embodiments described above the retardation ρ and azimuth angle β can both be tuned to their optimum values for a given value of δ. In an exemplary embodiment, either ρ or β set can be pre-determined value and the respective two other parameters can be adjusted to a optimum values.

Minimizing the Dependence of S on δ in Accordance with an Exemplary Embodiment

In particular when using non-annealed fibers, the birefringence δ of the sensing fiber can be more accurately determined. Hence, it can be more advantageous not to minimize the influence of δ on Z, but rather minimize the influence of δ on scaling factor S, which can be achieved if the condition $$\frac{\partial S}{\partial \delta} = 0, \quad (11)$$

is fulfilled.

In some applications, an accurate match of the condition of Eq. (11) may not be achieved due to manufacturing tolerances and, therefore, the error in (11) can be smaller than a reasonably small third threshold value $t_3$, i.e.

$$\left|\frac{\partial S}{\partial \delta}\right| < t_3 \quad (11')$$

An exemplary third threshold value $t_3$ giving good temperature independence but accounting for manufacturing tolerances is 0.2 [rad$^{-1}$], and in particular smaller than 0.05 [rad$^{-1}$].

In this case, the scaling factor of a device can be linearly independent of the birefringence δ, e.g. in case δ should change over time. Hence, in a second exemplary embodiment of the disclosure, the values of Q, β and ε (and thus ρ) are chosen such that the conditions of Eqs. (11) and (9) are met, which again allows optimum values of $\rho_{opt}$ and $\beta_{opt}$ to be derived from methods similar in manner to these described above.

Minimizing the Dependence of Z or S on β in Accordance with an Exemplary Embodiment When manufacturing the device, the value of the azimuth angle β can vary among individual devices due to manufacturing tolerances. Hence, it can also be advantageous to minimize the dependence of Z or S on the value of β, i.e.

$$\frac{\partial S}{\partial \beta} = 0 \text{ or} \quad (12a)$$

$$\frac{\partial Z}{\partial \beta} = 0. \quad (12b)$$

For a negligible amount of intrinsic birefringence present in the sensing fiber or if the axes of the intrinsic and bend-induced birefringence coincide, both conditions are fulfilled if β mod 90°=45°. Hence, in yet another exemplary embodiment of the disclosure, β can be selected such that β mod 90°=45°, with ε then being chosen to fulfill Eq. (9). Again, in some applications, condition (12a) or (12b) may not be matched accurately, and therefore a deviation of the angle, such as β mod 90°=45°±5° is tolerable.

Large Faraday Phase Shifts $\phi_F$ in Accordance with an Exemplary Embodiment

In the above embodiment it was assumed that the Faraday phase shift $\phi_F$ is small ($\phi_F \ll 1$). The approximation holds reasonably well within the range $\phi_F < 0.3$ rad, and in particular <0.1 rad. Significantly larger phase shifts ($\phi_F > 0.3$ rad) may be encountered e.g. in the electrolytic production of metals, for example at aluminum smelters, where currents up to about 500 kA can be measured. Here the term $4\phi_F$ can reach values up to, e.g., $2\pi$. As evident it is obvious from eq. (3)-(6) the scale factor S is then not only a function of ε, δ, and β but also depends on $\phi_F$ and thus on the current.

Figure 12:
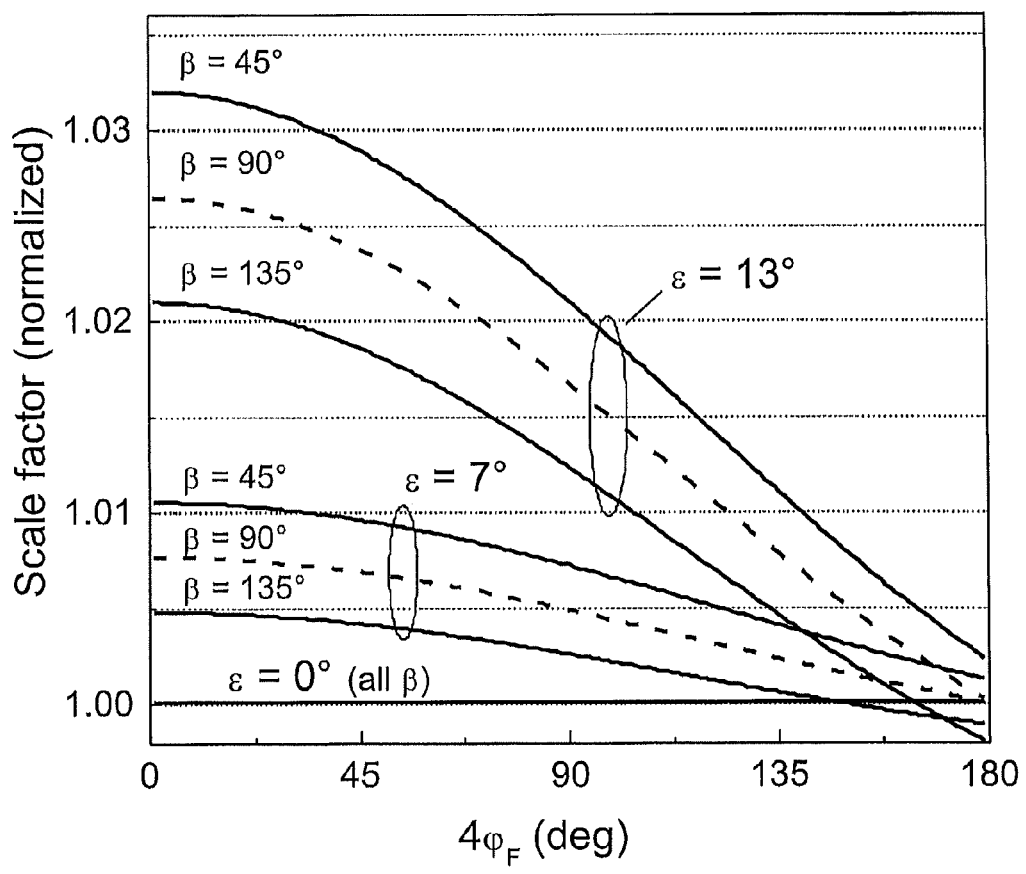
FIG. 12 shows the scale factor S as a function of $4\phi_F$ for three different retardations $\rho$ at azimuth angles $\beta$ of 45°, 90° and 135° in accordance with an exemplary embodiment.

FIG. 12 is a graphical illustration of the scale factor S as a function of $4\phi_F$ for three different retardations P at azimuth angles β of 45°, 90° and 135° in accordance with an exemplary embodiment. FIG. 12 shows the scale factor S as a function of $4\phi_F$ for three different retardations ρ=π/2+ε of the retarder. For each retardation, the scale factor is calculated for azimuth angles β of 45°, 90° and 135°. A sensor which has been optimized under the assumption of $\phi_F \ll 1$ may no longer be sufficiently optimized for larger $\phi_F$, i.e. if the condition $\phi_F \ll 1$ is no longer valid. Given the above considerations it is however possible, by applying the teaching given above, to again determine a set of parameters ε, δ, β, and/or Q which optimize the sensor instead at $\phi_F \ll 1$ in the vicinity of another value of $4\phi_F$, e.g. at $4\phi_F = \pi/2$ and the corresponding current.

It should be understood that at large Faraday phase shifts, the temperature dependence Z of the scale factor S=S(ε, δ, β, $\phi_F$) (eq. 8) implicitly includes a contribution from the temperature dependence of the Verdet constant via the term $\phi_F$=VNI. However, this contribution to Z, e.g. in Eqs. (9), (9'), is negligible compared to the temperature dependence of the Verdet constant (1/V) ∂V/∂T itself.

Derivation of Equations in Accordance with an Exemplary Embodiment

The following section describes approximations for the quantities Z and X as defined above.

The scale factor term S, for small currents (i.e. $4\phi_F \ll \pi$) can be expressed as:

$$S = \frac{\Delta\phi}{4\varphi_F} = \frac{1 + \frac{1}{3}\delta^2 + \frac{4}{3}\varphi_F^2}{\cos(\varepsilon) - \delta\sin(\varepsilon)\sin(2\beta)\left(1 + \frac{1}{3}\delta^2 + \frac{4}{3}\varphi_F^2\right)}, \quad (13)$$

where the parameters $\phi_F$, δ, β, and ρ having the same definition as provided above.

In accordance with an exemplary embodiment the formula for the scale factor and its temperature dependence can be accurate to a level of $\Delta S/S = 10^{-4}$. For the measurement of current in high-voltage substations, the measured Faraday phase shift can be small, i.e. $\phi_F < 0.05$ rad as well as the bend induced birefringence, i.e. δ<20° (~0.35 rad). The magnitude of ε usually is ε<12° (~0.2 rad). If keeping only leading terms the formula simplifies to:

$$S(\varepsilon, \delta, \beta) = \frac{\Delta\phi}{4\varphi_F} = \frac{M + \frac{1}{3}\delta^2}{\cos(\varepsilon) - g\delta\sin(\varepsilon)} \quad (14)$$

where, $$M = 1 + \frac{4}{3}\varphi_F^2 \text{ and } g = \sin(2\beta).$$

The temperature dependence of the scale factor (excluding Verdet constant changes)

$$Z = \frac{1}{S}\frac{\partial S}{\partial T}$$

can be governed by the temperature dependence of the birefringence δ in the sensing fiber $$\frac{\partial \delta}{\partial T} = P \cdot \delta \text{ with } P = 6 \cdot 10^{-4}[K^{-1}], \quad (15)$$

and the temperature dependence of $\epsilon$ according to $$\frac{\partial \varepsilon}{\partial T} = Q \cdot \rho \text{ with } |Q| = (1 \ldots 6) \cdot 10^{-4} [K^{-1}] \quad (16)$$

with Q a typical (measured) property of the retarder fiber. The coefficients P and Q are properties of the employed fibers and are $\neq 0$.

This temperature dependence of the scale factor Z is then given by:

$$Z = \frac{1}{S}\frac{\partial S}{\partial T} = \frac{1}{S}\left(\frac{\partial S}{\partial \varepsilon}\frac{\partial \varepsilon}{\partial T} + \frac{\partial S}{\partial \delta}\frac{\partial \delta}{\partial T}\right) = \frac{1}{S}\left(\frac{\partial S}{\partial \varepsilon} \cdot Q\rho + \frac{\partial S}{\partial \delta} \cdot P\delta\right), \quad (17)$$

or in detail:

$$Z = \quad (18)$$
$$Q\left(\varepsilon + \frac{\pi}{2}\right) \cdot \frac{\sin(\varepsilon) + g\delta\cos(\varepsilon)}{\cos(\varepsilon) - g\delta\sin(\varepsilon)} + P\delta\left(\frac{2\delta}{(3M + \delta^2)} + \frac{g\sin(\varepsilon)}{\cos(\varepsilon) - g\delta\sin(\varepsilon)}\right).$$

To implement insensitivity of Z against small variations in the birefringence of the sensing coil, i.e. to reduce the impact of manufacturing tolerances, the sensor head design parameters $\epsilon$ and $\beta$ can be selected such that:

$$X(\varepsilon, \beta, \delta) = \frac{\partial Z}{\partial \delta} = 0 \quad (19)$$

or in detail:

$$X = \frac{g\left(Q\rho + \frac{1}{2}P\sin(2\varepsilon)\right)}{(\cos(\varepsilon) - g\delta\sin(\varepsilon))^2} + \frac{4P\delta}{(3M + \delta^2)} \cdot \left[1 - \frac{\delta^2}{(3M + \delta^2)}\right]. \quad (20)$$

For a given amount of birefringence $\delta$ in the sensing fiber (to be measured), the parameters $\epsilon_{opt}$ and $\beta_{opt}$ can be calculated numerically in order to fulfill the boundary conditions $Z(\epsilon, \beta) = Z_0$ and $X(\epsilon, \beta) = 0$, e.g. with a Matlab Script.

As mentioned above, the sensing fiber 5 is advantageously an annealed fiber that can reside in an annealed glass capillary. Alternatively, the sensing fiber 5 can be a non-annealed fiber, again optionally residing in a capillary. Preferably (but not necessarily) the fiber is without a protective coating and the capillary is filled with friction reducing means.

Even though the above description focuses on a current sensor, the same techniques can also be applied to a magnetic field sensor. For magnetic field sensing the fiber does not form a closed loop but can be partially looped or aligned along a straight path. The sensor signal can then be proportional to the path integral ∫H·ds along a path connecting the two ends of the sensing fiber.

The value of $|Q|$ is typically between $1 \cdot 10^{-4}$ and $6 \cdot 10^{-4}$ $K^{-1}$.

The problem to be solved by the present disclosure is therefore to provide a versatile fiber optic current sensor or magnetic field sensor with small sensitivity to variations in the fiber birefringence, e.g. due to manufacturing tolerances or temperature changes.

This problem is solved by a fiber optic current sensor or magnetic field sensor that includes a sensing fiber exposed to a magnetic field of a current I to be measured. The sensing fiber is looped in a sensor plane, and the sensing fiber has a Verdet constant V, at least one retarder arranged between a polarization maintaining fiber and the sensing fiber for converting light between linear and elliptical polarization. A principal axis of the polarization maintaining (pm) fiber immediately before the retarder is rotated with respect to a normal of the sensor plane by an angle $\beta$. The retarder introduces a differential phase shift $\rho = \pi/2 + \epsilon$ between light waves polarized along its principal axes, with $\epsilon$ being an additional, non-zero phase shift, and a control unit generating a signal particular proportional to a current-induced phase shift $\Delta\phi$, which phase shift can be represented as $$\Delta\phi = 4S(\epsilon, \delta, \beta, \phi_F) \cdot \phi_F$$

with $\phi_F = V \cdot N \cdot I$. N is a number of loops of the sensing fiber, $\delta$ is a linear-birefringence-induced phase shift of the sensing fiber and S is a scale factor, wherein a normalized derivative of S in respect to temperature T is $$Z(\varepsilon(T), \delta(T), \beta, \varphi_F) = \frac{1}{S}\frac{\partial S(\varepsilon, \delta, \beta, \varphi_F)}{\partial T},$$

where $\beta$ and $\epsilon$ and $$Q = \frac{1}{\rho}\frac{\partial \rho}{\partial T}$$

are selected such that the condition $$\left|\frac{1}{\Delta\phi}\frac{\partial(\Delta\phi)}{\partial T}\right| < t_1$$

or equivalently the condition $$\left|Z + \frac{1}{V}\frac{\partial V}{\partial T}\right| < t_1$$

is fulfilled over a range of values of $\phi_F$ and for a non-zero value of the birefringence induced phase shift $\delta$ and its given temperature dependence $$P = \frac{1}{\delta}\frac{\partial \delta}{\partial T},$$

at least at a temperature $T_0$ preferably in the center of the operating temperature range of the sensor, with $t_1$ being a first threshold value smaller than $7*10^{-5}$ 1/K, in particular smaller than $2*10^{-5}$ 1/K. Hereafter, this condition is referred to as the "first condition".

The temperature dependence $$Q = \frac{1}{\rho}\frac{\partial \rho}{\partial T}$$

of the differential phase retardation ρ of the fiber retarder can be tailored to a certain extent by appropriately choosing the fiber parameters. The temperature dependence or temperature coefficient $$P = \frac{1}{\delta} \frac{\partial \delta}{\partial T}$$

of the linear birefringence in the sensing fiber corresponds approximately to $6*10^{-4}$ 1/K.

In the sensor according to the present disclosure, the phase shift term c as well as the orientation angle β of the pm fiber before the retarder are advantageously chosen such that the normalized derivative of the scale factor S with respect to temperature T is opposite in sign—and preferably similar or identical in magnitude—to the normalized derivative of the Verdet constant V with respect to temperature T. Under these conditions the retarder compensates—partially or fully—the temperature dependence of the Verdet constant V of the sensing fiber. When compared to other known systems or methods, the exemplary embodiments disclosed herein have an additional two degrees of freedom in that not only ε but also Q and β can be varied, and one additional degree of freedom if the value of Q is considered to be fixed at $Q_0$. The additional degree of freedom can be used for various optimizations.

In one exemplary embodiment, the additional degree of freedom can be used to select ε and β such that they fulfill, in addition to the first condition the following condition (advantageously at a temperature $T_0$ in the center of the operating range of the sensor):

$$\left|\frac{\partial Z}{\partial \delta}\right| < t_2$$

with $t_2$ being a second threshold value smaller than $2*10^{-3}$ $(K^{-1}*rad^{-1})$, in particular smaller than $0.5*10^{-3}$ $(K^{-1}*rad^{-1})$.

In other words, ε and β are selected such that not only the first condition is met, but that the first condition holds true (in linear approximation) even if the birefringence of the sensing fiber varies. This can be particularly useful for current sensors where the sensing fiber is an annealed fiber, i.e. a fiber subjected to thermal annealing after being bent to a coil, because in such systems the residual birefringence-induced phase shift δ may vary from device to device to some degree due to the tolerances in the annealing process. Furthermore, this is also useful for sensors with one or several loops of non-annealed fiber. Such non-annealed coils may have significantly higher birefringence than annealed coils and as a result larger absolute variation in δ as a function of temperature.

In another exemplary embodiment, the additional degree of freedom can be used to choose ε and β such that they fulfill, in addition to the first condition, the following condition:

$$\left|\frac{\partial S}{\partial \delta}\right| < t_3,$$

with $t_3$ being a third threshold value smaller than 0.2 $rad^{-1}$, and in particular smaller than 0.05 $rad^{-1}$.

In other words, ε and β are selected such that not only the first condition can be met, but also that the scale factor S is (in linear approximation) independent of variations in the sensing fiber birefringence, e.g. due to potential changes in the birefringence over time.

In yet another exemplary embodiment, the additional degree of freedom can be used to choose ε and β such that they fulfill, in addition to the first condition, the following condition:

$$\left|\frac{\partial S}{\partial \beta}\right| < t_4,$$

with $t_4$ being a forth threshold value smaller than 0.06 $[rad^{-1}]$, in particular smaller than 0.01 $[rad^{-1}]$. Thus, in linear approximation, S is independent on β, which can be the design less dependent on manufacturing tolerances in the orientation angle of the retarder. For cases in which intrinsic fiber birefringence is negligible or the axes of the intrinsic birefringence coincide with the axes of the bend induced birefringence, the above condition can be met for β mod 90°=45°, i.e. β=45°, 135°, etc.

In yet another exemplary embodiment, the additional degree of freedom can be used to choose ε and β such that they fulfill, in addition to the first condition, the following condition:

$$\left|\frac{\partial Z}{\partial \beta}\right| < t_5,$$

with $t_5$ being a fifth threshold value smaller than $5*10^{-4}$ $(K^{-1}*rad^{-1})$, in particular smaller than $1*10^{-4}$ $(K^{-1}*rad^{-1})$. Thus, in a linear approximation, Z is independent of β, which makes the design less dependent on manufacturing tolerances in the orientation angle of the retarder. For cases in which the amount of intrinsic linear birefringence in the fiber is negligible or its slow axis coincides with an axis of the bend induced birefringence, the above condition is best met for β mod 90°=45°, i.e. β=45°, 135°, etc.

In cases where the temperature dependence of the retarder Q can be chosen as well, e.g. by a proper choice of the type of the polarization maintaining fiber (e.g. elliptical core polarization-maintaining (PM)) fiber, stress induced PM fiber such as Panda, Bowtie, elliptical cladding) or by a proper choice of the parameters of a specific PM fiber (e.g. the doping or geometry of the fiber core) the presented sensor scheme has an additional two degrees of freedom after having met the first condition. The two degrees of freedom can be used for further optimizations.

In yet another exemplary embodiment, the two additional degrees of freedom can be used to select Q, ε and β such that they fulfill, in addition to the first condition, the following two conditions:

$$\left|\frac{\partial Z}{\partial \delta}\right| < t_2 \text{ and } \left|\frac{\partial S}{\partial \delta}\right| < t_3,$$

with $t_2$ and $t_3$ being equal to the same thresholds defined above. As a result, Q, ε and β are selected such that not only the first condition is met, but also in linear approximation, S and Z are independent on δ, which can be the design less dependent on manufacturing tolerances and on potential changes over time in the birefringence in the sensing fiber be it for annealed or non-annealed sensing coils.

In another exemplary embodiment, the two additional degrees of freedom can be used to choose Q, ε and β such that they fulfill, in addition to the first condition, the following two conditions:

$$\left|\frac{\partial Z}{\partial \delta}\right| < t_2 \text{ and } \left|\frac{\partial Z}{\partial \beta}\right| < t_5$$

with $t_2$ and $t_5$ being equal to the same thresholds defined above. As a result, Q, ε and β are selected such that not only the first condition is met, but also in linear approximation, Z is independent on δ and β, which makes the design less dependent on manufacturing tolerances with regard to the sensing fiber birefringence δ and the orientation angle β of the retarder, as well as on potential changes over time in the birefringence δ be it for annealed or non-annealed sensing coils.

Another exemplary embodiment provides that the two additional degrees of freedom can be used to choose Q, ε and β such that they fulfill, in addition to the first condition, the following two conditions:

$$\left|\frac{\partial Z}{\partial \delta}\right| < t_2 \text{ and } \left|\frac{\partial S}{\partial \beta}\right| < t_4,$$

with $t_2$ and $t_4$ being equal to the same thresholds defined above. Thus, Q, ε and β can be selected such that not only the first condition is met, but also in linear approximation, Z is independent of δ and S is independent of β, which can make the design less dependent on manufacturing tolerances in g and the orientation angle β of the retarder, as well as on potential changes over time in the birefringence in the sensing fiber be it for annealed or non-annealed sensing coils.

In an exemplary embodiment, the two additional degrees of freedom can be used to choose Q, ε and β such that they fulfill, in addition to the first condition, the following two conditions:

$$\left|\frac{\partial S}{\partial \delta}\right| < t_3$$

and $$\left|\frac{\partial S}{\partial \beta}\right| < t_4$$

with $t_3$ and $t_4$ being equal to the same thresholds defined above. As a result, Q, ε and β are chosen such that not only the first condition is met, but also, in linear approximation, S is independent of δ and β, which makes the design less dependent on manufacturing tolerances in the orientation angle β of the retarder, as well as on potential changes over time in the birefringence in the sensing fiber be it for annealed or non-annealed sensing coils.

In yet another exemplary embodiment, the two additional degrees of freedom can be used to choose Q, ε and β such that they fulfill, in addition to the first condition, the following two conditions:

$$\left|\frac{\partial S}{\partial \delta}\right| < t_3$$

and $$\left|\frac{\partial Z}{\partial \beta}\right| < t_5$$

with $t_3$ and $t_5$ being equal to the same thresholds defined above. As a result, Q, ε and β are chosen such that not only the first condition is met, but also, in linear approximation, S is independent of δ and Z is independent of β, which makes the design less dependent on manufacturing tolerances in the orientation angle β of the retarder, as well as on potential changes over time in the birefringence in the sensing fiber be it for annealed or non-annealed sensing coils.

For cases in which intrinsic fiber birefringence is negligible or the axes of the intrinsic birefringence coincide with the axes of the bend induced birefringence, the optimum choice of the parameter β to achieve insensitivity of S and Z against the orientation angle β is at the same value, namely is simultaneously met for β mod 90°=45°, i.e. β=45°, 135°, etc, and the parameters ε and Q can be chosen such that the first condition is met and $$\left|\frac{\partial Z}{\partial \delta}\right| < t_2$$

or $$\left|\frac{\partial S}{\partial \delta}\right| < t_3.$$

Various exemplary embodiments are listed in the dependent claims as well as in the description below.

The sensor according to the various embodiments of the disclosure minimizes the sensitivity of the temperature compensation scheme and/or the scaling factor S to variations in the fiber birefringence δ or other parameters, e.g. due to manufacturing tolerances or ageing effects. This is important particularly for small diameter coils with several windings, as needed e.g. in HV applications. Here, since the birefringent phase retardation δ and its variation with temperature are commonly larger than in single-fiber loops of large diameter as used e.g. in the measurement of high DC currents.

The variation of the sensor scale factor S with temperature is influenced by the retardation ρ=90°+ε of the retarder, by the azimuth angle β, and the fiber birefringence δ. By a proper choice of ρ and β, a sensor coil can be designed which is temperature-insensitive and independent of small variations in the fiber birefringence δ. When taking into account the temperature dependence of δ itself, a proper choice of the azimuth angle β deviates from the 0°-angle mentioned above by a significant amount, e.g. by Δβ=9° for typical fiber properties. The choice of the azimuth angle β and the corresponding retardation ρ can be based on the numerical evaluation of the temperature dependence of the scale factor which is derived from equations given and additionally from the temperature dependence of the bend induced birefringence as given in.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE NUMBERS AND SYMBOLS

1: control unit
2: pm fiber (polarization-maintaining fiber)
3: sensing head
4: retarder
5: sensing fiber 6: conductor
7: reflector
H: magnetic field
I: current
L: length of retarder
N: number of sensing fiber loops
P: temperature dependence or temperature coefficient of $\delta$
Q: temperature dependence or temperature coefficient of $\rho$
S: scale factor term
T: temperature
U: see Eq. (4)
V: Verdet constant of sensing fiber
X: birefringence variation impact
Z: normalized temperature derivative of S
n: Normal direction vor normal vector to plane of sensing fiber coil
$\beta$: $45°-\beta'$
$\beta'$: azimuth angle of retarder
$\delta$: birefringence-induced phase shift in sensing fiber
$\epsilon$: additional phase shift of retarder
$\rho$: (total) phase shift of retarder

What is claimed is:

1. A fiber optic current sensor or magnetic field sensor comprising:
   a sensing fiber exposed to a magnetic field of a current I, wherein said sensing fiber is looped in a sensor coil plane, and wherein said sensing fiber has a Verdet constant V,
   at least one retarder arranged between a polarization-maintaining fiber and said sensing fiber for converting light between linear and elliptical polarization, wherein a principal axis of said polarization-maintaining fiber is rotated with respect to a normal of said sensor coil plane by an angle $\beta$ and wherein said retarder introduces a retardation $\rho=\pi/2+\epsilon$ between light waves polarized along its principal axes, with $\epsilon$ being an additional, non-zero phase shift; and
   a control unit generating a signal proportional to a phase shift $\Delta\phi$, which signal is proportional to $4 S(\epsilon, \delta, \beta, \phi_F) \cdot V \cdot N \cdot I = 4 S(\epsilon, \delta, \beta, \phi_F) \cdot \phi_F$, wherein N is a number of loops of said sensing fiber, $\delta$ is a linear birefringence induced phase shift of said sensing fiber, $\phi_F$ is a Faraday phase shift and S is a scale factor, wherein a normalized derivative of S with respect to temperature T is $$Z(\varepsilon(T), \delta(T), \beta, \varphi_F) = \frac{1}{S} \frac{\partial S(\varepsilon, \delta, \beta, \varphi_F)}{\partial T}$$

wherein $\beta$, $\epsilon$ and $$Q = \frac{1}{\rho} \frac{\partial \rho}{\partial T}$$

are such that $$\left| Z + \frac{1}{V} \frac{\partial V}{\partial T} \right| < t_1$$

is fulfilled over a range of values of $\phi_F$ and for a non-zero value of the linear-birefringence-induced phase shift $\delta$ and its given temperature dependence $$P = \frac{1}{\delta} \frac{\partial \delta}{\partial T},$$

at least at a temperature $T_0$, in particular in a center of an operating temperature range of the sensor, with $t_1$ being a first threshold value smaller than $7*10^{-5}$ 1/K, in particular smaller than $2*10^{-5}$ 1/K.

2. The sensor of claim 1, wherein Q, $\beta$ and $\epsilon$ are such that $$\left| \frac{\partial Z}{\partial \delta} \right| < t_2,$$

with $t_2$ being a second threshold value smaller than $2*10^{-3}$ $(K^{-1}*rad^{-1})$, in particular smaller than $0.5*10^{-3}$ $(K^{-1}*rad^{-1})$.

3. The sensor of claim 1 wherein Q, $\beta$ and $\epsilon$ are such that $$\left| \frac{\partial S}{\partial \delta} \right| < t_3,$$

with $t_3$ being a third threshold value smaller than 0.2 $[rad^{-1}]$, in particular smaller than 0.05 $[rad^{-1}]$.

4. The sensor of claim 1 wherein $\beta$ mod $90°=45°\pm5°$.

5. The sensor of claim 2, wherein Q, $\beta$ and $\epsilon$ are such that $$\left| \frac{\partial S}{\partial \delta} \right| < t_3,$$

with $t_3$ being a third threshold value smaller than 0.2 $[rad^{-1}]$, in particular smaller than 0.05 $[rad^{-1}]$.

6. The sensor of claim 2, wherein Q, $\beta$ and $\epsilon$ are such that $$\left| \frac{\partial S}{\partial \beta} \right| < t_4,$$

with $t_4$ being a forth threshold value smaller than 0.06 $[rad^{-1}]$, in particular smaller than 0.01 $[rad^{-1}]$.

7. The sensor of claim 2, wherein Q, $\beta$ and $\epsilon$ are such that $$\left| \frac{\partial Z}{\partial \beta} \right| < t_5,$$

with $t_5$ being a fifth threshold value smaller than 0.0005 $[K^{-1}*rad^{-1}]$, in particular smaller than 0.0001 $[K^{-1}*rad^{-1}]$.

8. The sensor of claim 3, wherein Q, $\beta$ and $\epsilon$ are such that $$\left| \frac{\partial S}{\partial \beta} \right| < t_4,$$

with $t_4$ being a forth threshold value smaller than 0.06 $[rad^{-1}]$, in particular smaller than 0.01 $[rad^{-1}]$.

9. The sensor of claim 3, wherein Q, $\beta$ and $\epsilon$ are such that $$\left| \frac{\partial Z}{\partial \beta} \right| < t_5,$$

with $t_5$ being a fifth threshold value smaller than 0.0005 $[K^{-1}*rad^{-1}]$, in particular smaller than 0.0001 $[K^{-1}*rad^{-1}]$.

10. The sensor of claim 1, wherein said sensing fiber is an annealed fiber.

11. The sensor of claim 10, wherein said annealed sensing fiber resides in an annealed glass capillary.

12. The sensor of any of the claim 1, wherein said sensing fiber is a non-annealed fiber.

13. The sensor of claim 1, wherein said sensing fiber is a non-annealed fiber residing in a capillary.

14. The sensor of claim 1, wherein said retarder comprises a further polarization maintaining fiber.

15. The sensor of claim 1, wherein said retarder comprises an elliptical core fiber.

16. The sensor of claim 1, wherein $$Z = \frac{1}{S}\frac{\partial S}{\partial T} = \frac{1}{S}\left(\frac{\partial S}{\partial \varepsilon} \cdot Q\rho + \frac{\partial S}{\partial \delta} \cdot P\delta\right)$$

with $$\frac{\partial \delta}{\partial T} = P \cdot \delta$$

and $$\frac{\partial \varepsilon}{\partial T} = Q \cdot \rho,$$

with non-zero coefficients P and Q.

17. The sensor of claim 1, wherein $|Q|=(1\ldots6)\cdot 10^{-4}\,K^{-1}$.

18. The sensor of claim 1 wherein $\phi_F < 0.1$ rad.

19. The sensor of claim 1 wherein $\phi_F > 0.3$ rad.

* * * * *